United States Patent [19]

Niki

[11] Patent Number: 5,222,070
[45] Date of Patent: Jun. 22, 1993

[54] OPTICAL PULSE OSCILLATOR AND LIGHT FREQUENCY MEASURING APPARATUS USING THE SAME

[75] Inventor: Shoji Niki, Saitama, Japan
[73] Assignee: Advantest Corporation, Tokyo, Japan
[21] Appl. No.: 803,997
[22] Filed: Dec. 9, 1991

[30] Foreign Application Priority Data

Dec. 12, 1990 [JP] Japan .................. 2-401551

[51] Int. Cl.$^5$ .................. H01S 3/10; H01S 3/08
[52] U.S. Cl. .................. 372/25; 372/38; 372/43; 372/46; 372/92; 372/97; 372/700
[58] Field of Search .................. 372/18, 25, 38, 43, 372/46, 92, 97, 700

[56] References Cited

U.S. PATENT DOCUMENTS

| | | | |
|---|---|---|---|
| 4,464,759 | 8/1984 | Haus et al. | 372/18 |
| 4,622,672 | 11/1986 | Coldren et al. | 372/92 |
| 4,667,331 | 5/1987 | Alferness et al. | 372/18 |
| 4,734,910 | 3/1988 | Izadpanah | 372/92 |
| 4,829,531 | 5/1989 | Kawanishi et al. | 372/19 |
| 5,062,113 | 10/1991 | Takahashi | 372/25 |
| 5,097,476 | 3/1992 | Thiessen | 372/92 |
| 5,128,949 | 7/1992 | Barnes | 372/25 |
| 5,128,950 | 7/1992 | Tsuchiya et al. | 372/25 |
| 5,157,676 | 10/1992 | Wilcox | 372/25 X |
| 5,172,382 | 12/1992 | Loh et al. | 372/25 X |

Primary Examiner—Brian Healy
Attorney, Agent, or Firm—Staas & Halsey

[57] ABSTRACT

A microwave active element is connected in series to a drive circuit of a laser light emitting element and the laser light emitting element is caused to operate as a microwave resonator as viewed from the microwave active element. Laser light from the laser light emitting element is delayed by a delay controller and fed back to the laser light emitting element to control its delay time, thereby controlling the microwave resonance frequency. At the resonance frequency the microwave active element oscillates pulses and provides a microwave signal to its output terminal. The laser light emitting element is driven by a current flowing across the microwave active element and repeatedly emits, at its pulse oscillation frequency, laser light pulses of spectral frequencies which bear higher harmonic relation to the self-oscillation frequency of the microwave active element. By frequency sweeping the resonance frequency of the microwave resonator, the frequency of the laser light can be frequency swept. With the use of the frequency-swept laser light, it is possible to obtain a light frequency measuring apparatus for measuring the frequency of light to be measured.

14 Claims, 8 Drawing Sheets

OPTICAL PULSE OSCILLATOR AND LIGHT FREQUENCY MEASURING APPARATUS USING THE SAME

BACKGROUND OF THE INVENTION

The present invention relates to an optical pulse oscillator which is capable of simultaneously generating, in addition to the fundamental wave in the microwave band, higher harmonics ranging from millimetric to light waves and is suitable for use in constructing a light frequency measuring apparatus, for example. The invention also pertains to the light frequency measuring apparatus using the optical pulse oscillator.

If an electric signal of a frequency related to, for example, the frequency of laser light to be emitted from a laser light source is available from a laser driver, the frequency of light can be determined through utilization of the frequency of the electric signal, besides the frequency of light to be measured can be measured, based on the laser light. Moreover, if the frequency of laser light from the laser light source can be controlled electrically, it is of great utility in practice, because it permits the production of light of a desired frequency.

In view of the above, it is considered to obtain the frequency of a light wave by, for instance, frequency-multiplying microwaves from a microwave generator by use of a frequency multiplier. In this case, however, higher harmonics obtainable by the frequency multiplication of microwaves are limited to higher harmonics in the millimetric wave band at the highest and no higher harmonics corresponding to frequencies of light waves are obtainable. Thus, it is impossible, with the prior art, to obtain an electric signal of a frequency related to that of laser light and electrically control the frequency of laser light from the laser light source through mere frequency multiplication of microwaves.

SUMMARY OF THE INVENTION

It is therefore an object of the present invention to provide an optical pulse oscillator capable of simultaneously generating not only the fundamental wave in the microwave band but also higher harmonics ranging from millimetric to light waves and a light frequency measuring apparatus employing such an optical pulse oscillator.

According to a first aspect of the present invention, the optical pulse generator is made up of a laser light emitting element for emitting multimode laser light, delay control means for feeding the laser light back to the laser light emitting element after delaying it for a predetermined time, a microwave active element connected in series to a drive current path of the laser light emitting element and having a negative resistance characteristic in the series-connected portion, an electrical output terminal for extracting therethrough a change in the current flowing through the microwave active element and a light emitting portion for emitting therethrough laser light from the laser light emitting element.

With the arrangement according to the first aspect of the invention, the microwave active element forms a microwave oscillator and the laser light source is supplied with its drive current of the microwave band which the microwave oscillator oscillates. The laser light source emits laser light of a frequency which bears a harmonic relationship to the oscillation frequency of the microwave oscillator. Consequently, the frequency of laser light from the laser light source can be detected by measuring the frequency of the oscillation signal of the microwave oscillator. Since the frequency of laser light can thus be made preknown, the optical pulse oscillator is suitable for use in measuring the frequency of light.

According to a second aspect of the present invention, in the above optical oscillator an input terminal is provided in association with the microwave active element and a sample-hold circuit is connected to the electrical output terminal provided for extracting a change in the current flowing through the microwave active element.

With the arrangement according to the second aspect of the invention, a signal corresponding to a phase difference between the frequency of an external reference signal and the oscillation frequency of the microwave active element can be obtained from the sample-hold circuit by applying a signal of a known frequency to the input terminal of the microwave active element. The signal corresponding to the phase difference has a frequency equal to the difference between the reference signal and the self-oscillation signal. By measuring this frequency difference, the oscillation frequency of the microwave active element can be known. Further, the frequency of laser light can also be known from the oscillation frequency of the microwave active element. The frequency of the output signal from the sample-hold circuit is the above-said frequency difference and hence is the lower frequency. Hence, the waveform of the output signal can be observed on an oscillograph or similar simple measuring instrument and its frequency can also be measured relatively easily.

According to a third aspect of the present invention, in the optical pulse oscillator provided with the sample-hold circuit as mentioned above, the laser light emitting element includes delay control means, which is supplied with the output signal corresponding to the above-mentioned phase difference from the sample-hold circuit to thereby control the delay time of the delay control means.

With the arrangement according to the third aspect of the invention, it is possible to change the frequency of laser light which is emitted by the laser light emitting element, through control of the delay time of its delay control means by the signal of the frequency difference. As the frequency of the laser light varies, the oscillation frequency of the microwave active element also varies and eventually becomes equal to the frequency of the external reference signal and the microwave active element performs synchronous oscillation at that frequency. Thus, laser light of a desired frequency can be emitted by a suitable selection of the frequency of the reference signal which is applied to the microwave active element, besides the frequency of the laser light can be frequency-swept.

According to fourth and subsequent aspects of the present invention, an optical pulse oscillator whose resonance frequency is controlable is provided with a frequency sweep control circuit, by which the self-oscillation frequency of the optical pulse oscillator and the spectrum of the laser light are frequency swept. The laser light and light to be measured are coupled together by an optical coupler and the coupled light is transduced by an opto-electro transducer into an electric signal. By this, zero beat between a plurality of spectra of the laser light and the light to be measured occurs upon each occurrence of the coincidence between frequency of the light to be measured and the frequency of the swept spectrum. Hence, the frequency of the light to be measured can be detected, based on the number of times of the occurrence of zero beat and the oscillation frequency of the optical pulse oscillator at each of the frequency sweep start and stop points.

DESCRIPTION OF THE PREFERRED EMBODIMENTS

Figure 1:
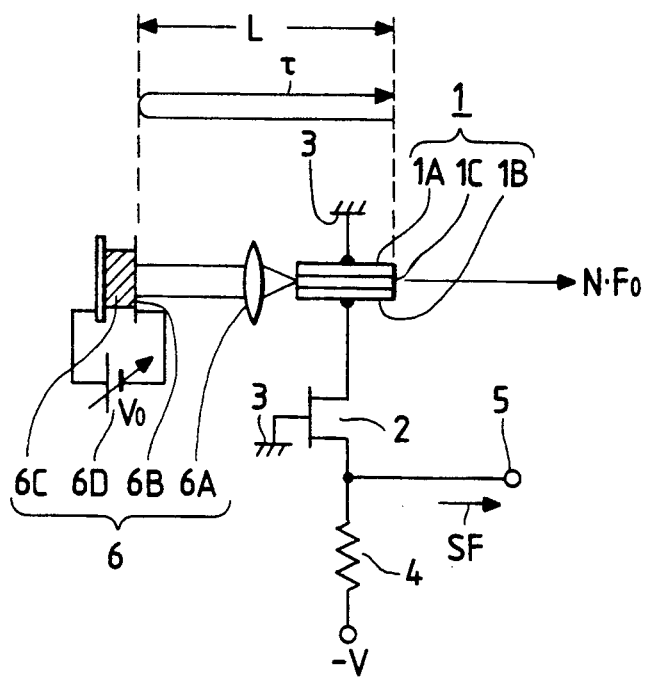
FIG. 1 is a schematic diagram illustrating an embodiment of the optical pulse oscillator according to the first aspect of the present invention.
Figure 4:
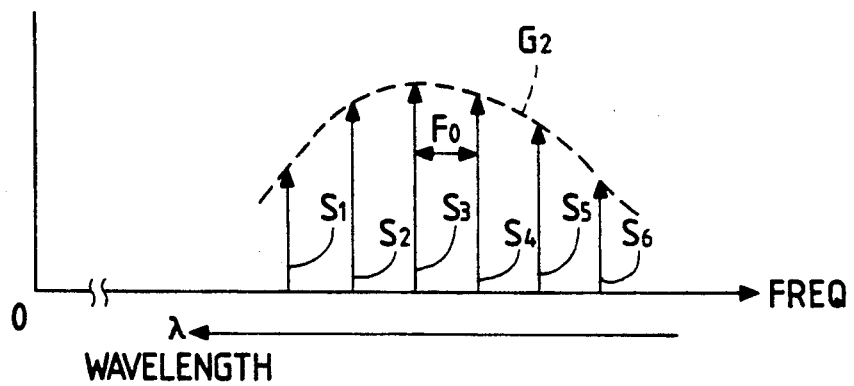
FIG. 4 is a schematic diagram showing a laser light spectrum, for explaining the operation of the optical pulse oscillator depicted in FIG. 1.

FIG. 1 illustrates an embodiment of the optical pulse oscillator according to the first aspect of the present invention. Reference numeral 1 indicates a laser light emitting element, which emits multimode laser light containing a plurality of spectra $S_1$, $S_2$, $S_3$, $S_4$, ... as shown in FIG. 4. This embodiment employs, as the laser light emitting element 1, a semiconductor laser light emitting element including an external resonator.

Reference numeral 2 denotes a microwave active element, which in connected in series to a drive current path to the laser light emitting element 1. The laser light emitting element 1 has its one electrode 1A connected to a common potential point 3 and has the other electrode 1B connected to a negative power supply $-V$ via the microwave active element 2 and a resistor 4. An output terminal 5 is connected to the junction of the microwave active element 2 and the resistor 4. In this embodiment the microwave active element 2 is shown to be a field effect transistor, which has its gate connected to the common potential point 3.

The laser light emitting element 1 has a light emitting part 1C, to which delay control means 6 is optically coupled. The delay controller 6 constitutes an external resonator whose resonance frequency is controlable and can be formed by a condenser lens 6A, a reflector 6B, a driver 6C for shifting the reflector 6B and a control power supply 6D for controlling the driver 6C. The delay controller 6 in this embodiment is shown to have an arrangement in which the optical path length L is varied by shifting the reflector 6B through control of the voltage $V_0$ of the control power supply 6D to vary the time $\tau$ of propagation of light back and forth over the optical path, thereby permitting control of the resonance frequency of the external resonator. For example, a piezoelectric element can be used as the driver 6C. The optical path length L may also be varied by use of a structure in which the reflector 6B and the laser light emitting element 1 are mounted on a common substrate not shown and the substrate temperature is controlled by a Peltier element.

With the arrangement shown in FIG. 1, letting the time for light to propagate back and forth over the optical path L be represented by $\tau$, the laser light emitting element 1, as viewed from the microwave active element 2, operates as a microwave oscillator of a resonance frequency $F_0 = 1/\tau$. The microwave active element 2, viewed from the laser light emitting element 1, shows a negative resistance characteristic in the vicinity of the frequency $F_0$. Consequently, the microwave active element 2 oscillates at the frequency $F_0$ and the laser light emitted from the laser light emitting element 1 is locked in a state in which respective spectra $S_1$, $S_2$, $S_3$, $S_4$, ... are spaced the frequency $F_0$ apart as shown in FIG. 4. This state will hereinafter called a state in which the laser light is mode-locked at the frequency $F_0$.

Figure 2:
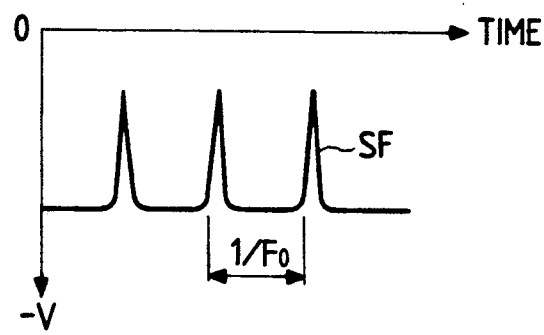
FIG. 2 is an oscillation waveform diagram for explaining the operation of the optical pulse oscillator depicted in FIG. 1.
Figure 3:
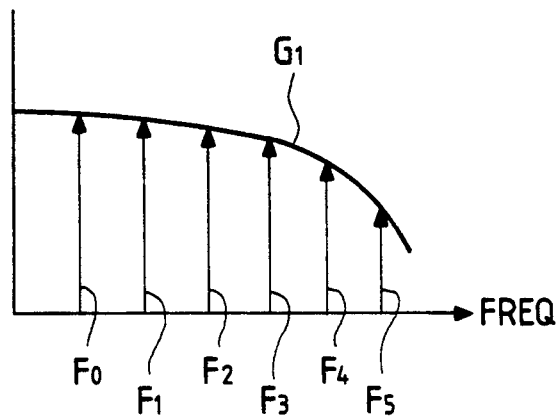
FIG. 3 is a schematic diagram showing a microwave oscillation spectrum, for explaining the operation of the optical pulse oscillator depicted in FIG. 1.

FIG. 2 shows an example of the waveform of an oscillation signal SF which is provided to the output terminal 5. The oscillation signal SF is a pulse-like current of a period $1/F_0$ and contains higher harmonics $F_1$, $F_2$, $F_3$, $F_4$, ... with the frequency $F_0$ as the fundamental wave, as shown in FIG. 3. The curve $G_1$ in FIG. 3 indicates the gain characteristics of the microwave active element 2. The laser light emitting element 1 is driven by the pulse-like current flowing across the microwave active element 2 and emits light of a frequency $N.F_0$ pulse-wise with a repetitive frequency $F_0$, and the spectra of the light are mode-locked at the frequency $F_0$. In the above, N is the wave number of each spectral component present in the optical path L.

Assuming, for example, that the laser light emitting element 1 is one that is able to emit light of wavelengths ranging from 1.5 to 1.6 μm (200 to 187.4 THz in frequency) and that the oscillation frequency $F_0$ of the microwave active element 2 is 10 GHz, the laser light emitting element 1 is capable of generating spectra spaced 10 GHz apart over the frequency range from 187.5 to 200 THz, and the value which the wave number N corresponding to each of such spectra is an integer within the range of between $1.875 \times 10^4$ and $2 \times 10^4$.

FIG. 4 shows the mode-locked spectra of the laser light. That is, the spectra $S_1$, $S_2$, $S_3$, $S_4$, . . . of the laser light are arranged at regular intervals of the frequency $F_0$. In FIG. 4 the broken line $G_2$ indicates the gain characteristic of the laser light emitting element 1. The oscillation frequency $F_0$ of the microwave active element 2 and the light emitting frequency of the laser light emitting element 1 can be controlled by changing the voltage $V_0$ of the control power supply 6D. In other words, by changing the voltage $V_0$ of the control power supply 6D, the position of the reflector 6C is changed relative to the light emitting part 1C of the laser light emitting element 1, by which the optical path length L is varied. As the result of this, the time $\tau$ for light to travel back and forth between the reflector 6B and the laser light emitting element 1 changes accordingly, and hence the resonance frequency of the microwave resonator formed by the laser light emitting element 1 and the delay controller 6, viewed from the microwave active element 2, changes and the oscillation frequency $F_0$ of the microactive element 2 changes correspondingly. By continuously changing the oscillation frequency $F_0$ of the microwave active element 2, the light emitting frequency $N \cdot F_0$ of the laser light emitting element 1 can be varied continuously.

Thus, the optical pulse oscillator of the present invention provides the microwave signal at the electrical output terminal 5 and, further, permits simultaneous emission of laser light of frequencies bearing the higher harmonic relationship to the microwave. In addition, the frequency $F_0$ of the microwave and the frequency $N \cdot F_0$ of the laser light can arbitrarily be changed by controlling the voltage $V_0$ of the control power supply 6D. Hence, it is possible for the laser light emitting element 1 to emit light of a desired frequency within the wavelength range over which the laser light emitting element 1 is able to emit light.

Figure 5:
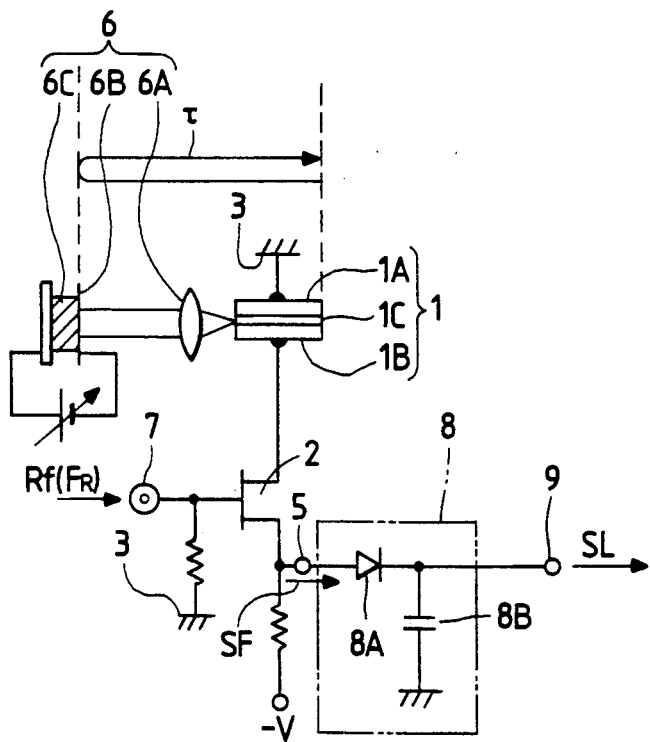
FIG. 5 is a schematic diagram illustrating an embodiment of the optical pulse oscillator according to the second aspect of the present invention.

FIG. 5 illustrates an embodiment of the optical pulse oscillator according to the second aspect of the present invention.

Figure 6A:
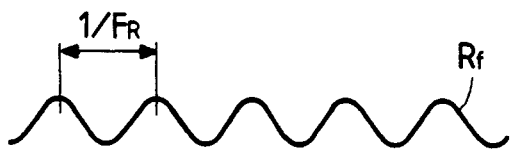
FIG. 6A is a waveform diagram of a reference signal which is applied to the optical pulse oscillator shown in FIG. 5.
Figure 6B:
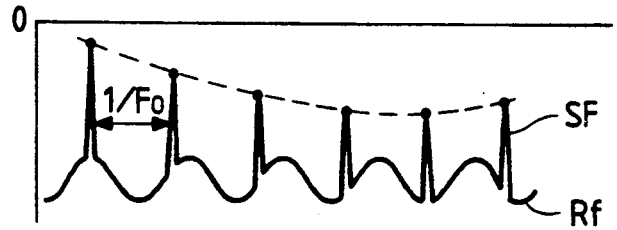
FIG. 6B is a waveform diagram of a microwave oscillation signal available from a microwave active element in FIG. 5.

According to the second aspect of the invention, a control terminal of the microwave active element 2 in FIG. 1 is provided, that is, an input terminal 7 is connected to its gate, and a sample-hold circuit 8 is connected to the electrical output terminal 5 and a sample-hold signal is extracted from an output terminal 9 of the sample-hold circuit 8. To the input terminal 7 is applied a reference signal $R_f$ which has a frequency $F_R$ close to the oscillation frequency $F_0$ of the microwave active element 2 as depicted in FIG. 6A.

Figure 6C:
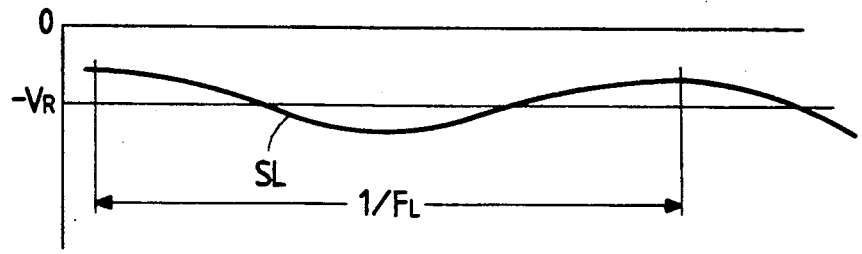
FIG. 6C is a waveform diagram of a signal which is obtained by sampling-holding the output of the microwave active element in FIG. 5.

The sample-hold circuit 8 in this embodiment is shown to be formed by a diode 8A and a capacitor 8B. By holding the peak value of the oscillation signal SF in the capacitor 8B by means of the diode 8A, a signal SL shown in FIG. 6C is provided at the output terminal 9. The height of each peak of the signal SF corresponds to the phase difference of the pulse relative to the reference signal $R_f$, and consequently, the level of the signal SL which is obtained while retaining such peaks varies corresponding to the phase difference between the reference signal $R_f$ and the self-oscillation signal SF and the frequency $F_L$ of the signal SL is $F_L = F_0 - F_R$.

With the provision of the input terminal 7 and the sample-hold circuit 8 which are connected to the microwave active element 2 and the electrical output terminal 5, respectively, it is possible to obtain at the output terminal 9 of the sample-hold circuit 8 the signal SL of the frequency $F_L$ which is equal to the difference between the frequency $F_R$ of the reference signal $R_f$ applied to the input terminal 7 and the self-oscillation frequency $F_0$ of the microwave active element 2. Hence, if the frequency $F_R$ of the reference signal $R_f$ is preknown, then the self-oscillation frequency $F_0$ of the microwave active element 2 can be detected by measuring the frequency $F_L$ of the signal SL. Moreover, once the self-oscillation frequency $F_0$ of the microwave active element 2 is thus known, the frequency $N \cdot F_0$ of the laser light which is emitted form the laser light emitting element 1 can be obtained.

As described above, according to the second aspect of the invention, it is possible to obtain the signal SL of a frequency lower than the self-oscillation frequency $F_0$ of the microwave active element 2, in addition to the operational effect obtainable according to the first aspect of the invention, and by measuring the frequency $F_L$ of the signal SL, the self-oscillation frequency $F_0$ of the microwave active element 2 and the frequency $N \cdot F_0$ of the laser light from the laser light emitting element 1 can be detected. Thus, the second aspect of the present invention offers the advantage of permitting the detection of the frequency of laser light without using a measuring instrument therefor.

Figure 7:
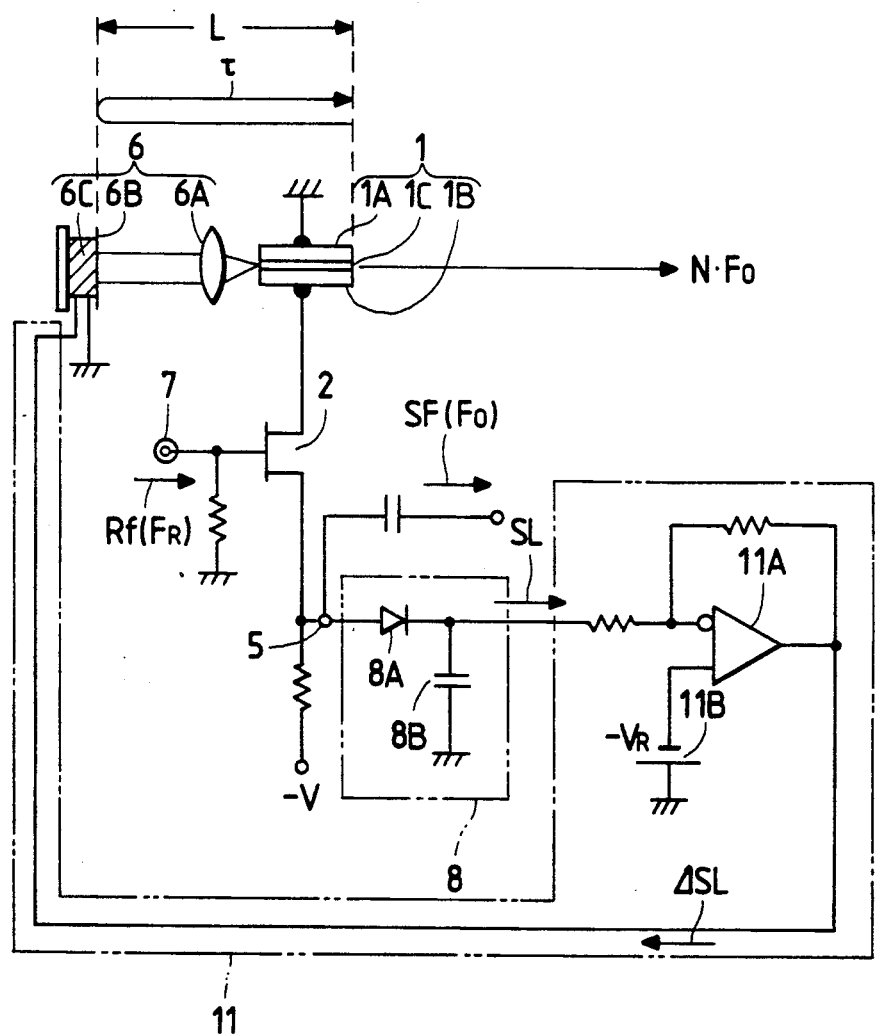
FIG. 7 is a schematic diagram illustrating an embodiment of the optical pulse oscillator according to the third aspect of the present invention.

FIG. 7 illustrates an embodiment of the optical pulse oscillator according to the third aspect of the present invention, which has its feature in that a feedback circuit 11 is provided for feeding back the output of the sample-hold circuit 8 to the delay controller 6 in FIG. 5.

The feedback circuit 11 can be formed by a deviation amplifier 11A. The output voltage of the sample-hold circuit 8 is compared with a reference voltage $V_R$ and the deviation voltage detected is amplified by the deviation amplifier 11A, the amplfied output voltage of which is applied to the driving element 6C of the delay controller 6. At the same time, the reference signal $R_f$ is applied to the input terminal 7 of the microwave active element 2, by which the signal SL (FIG. 6C) corresponding to the phase difference between the reference signal $R_f$ and the self-oscillation signal SF is obtained at the output of the sample-hold 8.

The signal SL is compared with the reference voltage $V_R$ in the deviation amplifier 11A and the resulting deviation signal $\Delta$SL is applied to the driving element 6C. The driving element 6C shifts the reflector 6B in accordance with the deviation signal $\Delta$SL, thereby controlling the optical path length L. By the control of the optical path length L the time $\tau$ for light to go back and forth between the reflector 6B and the laser light emitting element 1 is controlled, and consequently, the resonance frequency of the microwave resonator viewed from the microwave active element 2 is controlled. By the control of the resonance frequency the self-oscillation frequency $F_0$ of the microwave active element 2 is controlled and the signal SL is controlled to become equal to the reference voltage $V_R$. When the signal SL is equal to the reference voltage $V_R$, the frequency $F_R$ of the reference signal $R_f$ and the frequency $F_0$ of the self-oscillation signal SF stably remain equal to each other.

Thus, according to the third aspect of the invention, the self-oscillation frequency $F_0$ of the microwave active element 2 can be brought into coincidence with the frequency $F_R$ of the eternal reference signal $R_f$. Hence, the self-oscillation frequency $F_0$ of the microwave active element 2 can be controlled from the outside by freely setting the frequency $F_R$ of the reference signal $R_f$. In consequence, the light emitting frequency $N \cdot F_0$ of the laser light emitting element 1 can freely be set in the wavelength region over which the element 1 is capable of emitting light. The variation in the oscillation frequency $F_0$ by temperature changes in the laser light emitting element 1, the microwave active element 2 and the driving element 6C is totally compensated for by the feedback circuit 11, and consequently, the oscillation frequency $F_0$ can be held equal to the frequency $F_R$.

Figure 8:
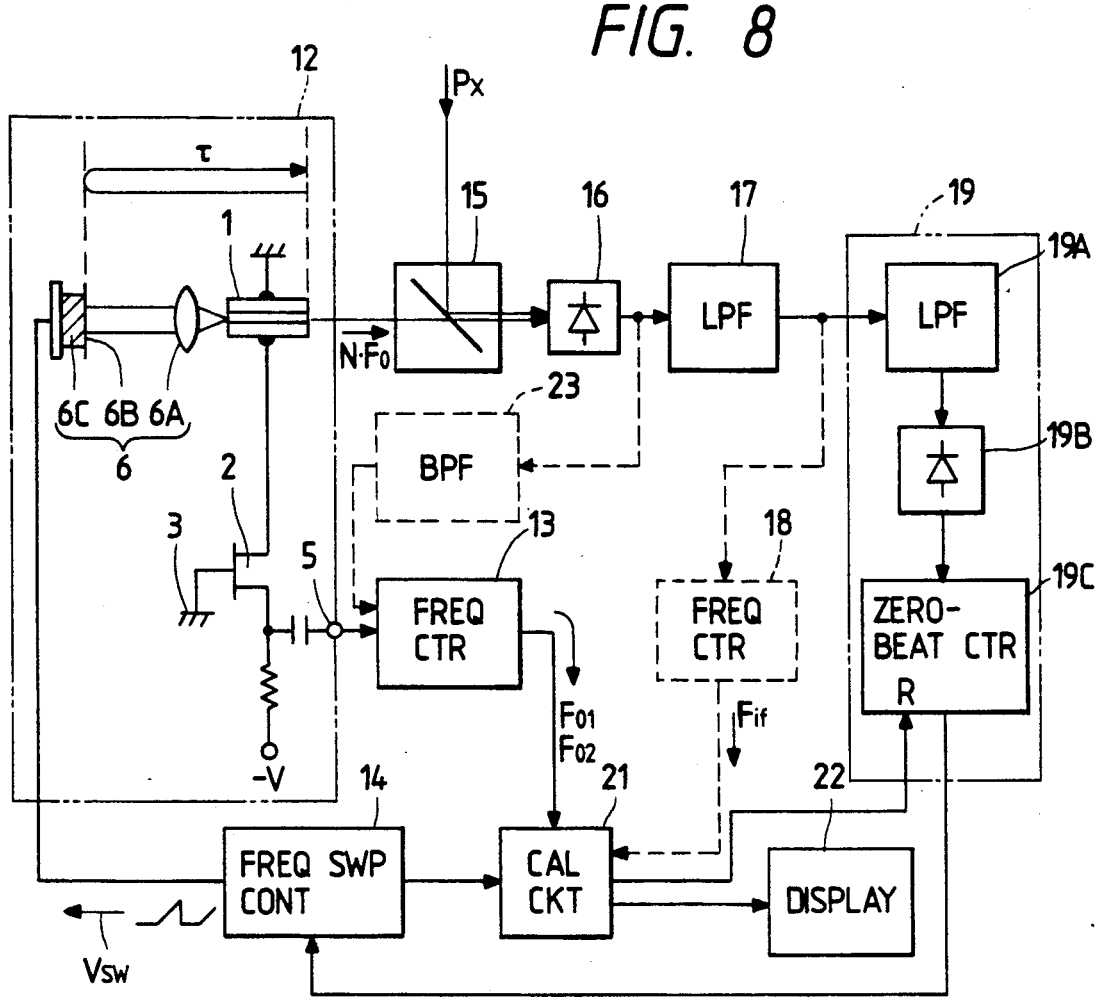
FIG. 8 is a schematic diagram illustrating an embodiment of the light frequency measuring apparatus according to the fourth aspect of the present invention which employs the optical pulse oscillator.

FIG. 8 illustrates an embodiment of the light frequency measuring apparatus employing the optical pulse oscillator according to the fourth aspect of the present invention. According to the fourth aspect of the invention, the optical pulse oscillator described previously with respect to the first to third aspects of the invention is utilized to form an apparatus for measuring the frequency of coherent light.

In FIG. 8 reference numeral 12 denotes the above-described optical pulse oscillator, which is made up of the laser light emitting element 1, the microwave active element 2, the delay controller 6 associated with the laser light emitting element 1 and the electrical output terminal 5 for detecting a change in the current flowing across the microwave active element 2 as referred to above. In this embodiment the field effect transistor forming the microwave active element 2 has its gate connected to the common potential point 3 as in the optical pulse oscillator proposed according to the first aspect.

Figure 9:
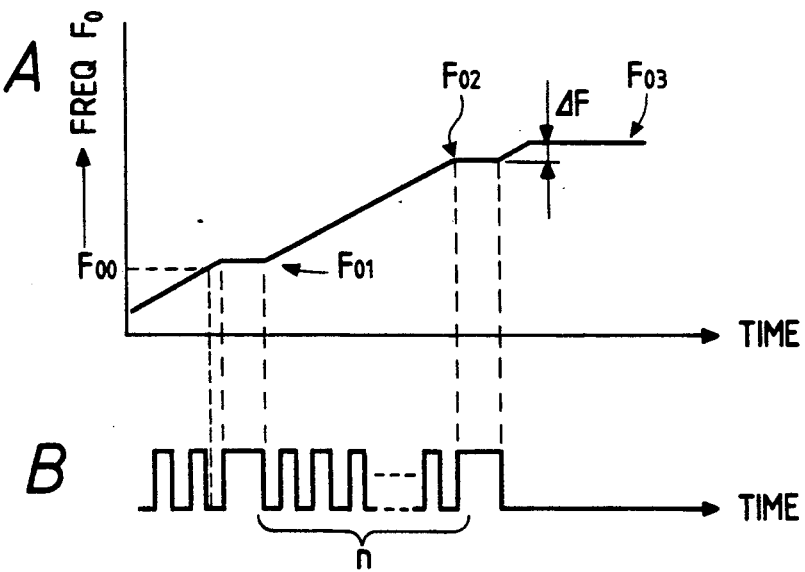
FIG. 9 is a graph for explaining an oscillation frequency sweep and the detection of zero beat in the light frequency measuring apparatus shown in FIG. 8.

According to the fourth aspect of the present invention, a frequency counter 13 is connected to the electrical output terminal 5, for measuring the oscillation frequency $F_0$ of the microwave active element 2, and the delay controller 6 is supplied with a saw-tooth ramp voltage $V_{SW}$ from a frequency sweep control circuit 14. By applying the ramp voltage $V_{SW}$ to the driving element 6C of the delay controller 6, the reflector 6B is shifted at a constant speed. As the reflector 6B moves, for example, toward the laser light emitting element 1 at the constant speed, the resonance frequency of the microwave resonator formed by the laser light emitting element 1 and the delay controller 6 rises, and by this change of the resonance frequency, the oscillation frequency $F_0$ of the microwave active element 2 is frequency swept in a direction in which it linearly rises as shown in FIG. 9.

By the frequency sweep of the oscillation frequency $F_0$ of the microwave active element 2, the frequency $N \cdot F_0$ of the spectrum of the laser light which is emitted from the laser light emitting element 1 is also frequency swept. The laser light emitted from the laser light emitting element 1 is provided to a coupler 15. Coherent light to be measured Px is also provided to the coupler 15. Let the frequency of the light Px be represented by Fx.

The laser light from the laser light emitting element 1 and the coherent light Px are coupled together by the coupler 15. The coupled light is input into an optoelectro transducer 16, by which it is transduced into an electric signal. The electric signal thus transduced by the transducer 16 is output therefrom as a signal which has frequency components of the differences between the frequency $N \cdot F_0$ of respective spectral components of the laser light and the frequency Fx of the coherent light Px, i.e. beat frequency components of the said differences. In this embodiment there is provided a low-pass filter 17 whose cutoff frequency is, for example, lower than the half ($F_0/2$) of the spectral spacing $F_0$ of the laser light (see FIG. 4) by which is extracted that one of the difference frequency components which is, for example, the frequency component of the difference between the frequency Fx of the light Px and the laser light spectrum closest thereto. The difference beat frequency component output from the low-pass filter 17 is provided to a zero beat counter circuit 19.

The zero beat counter circuit 19 comprises, for instance, a low-pass filter 19A which detects that the beat frequency has approached zero, a detector 19B which rectifies and smoothens the output signal of the low-pass filter 19A into a pulse signal (see FIG. 9B), and a zero beat counter 19C which counts output pulse signals of the detector 19B to count the number of times of coincidence between the laser light spectrum which is frequency swept and the frequency Fx of the light Px. By the frequency sweep of the frequency of the laser light, the spectra $S_1$, $S_2$, $S_3$, $S_4$, ... shown in FIG. 4 move in one direction and sequentially pass the frequency Fx of the light Px. Consequently, the output signal frequency of the low-pass filter 17 lowers as the spectra approach the frequency Fx and rises as the spectra depart from the frequency Fx, and when the output signal frequency has become substantially equal to the frequency Fx, the zero beat occurs.

The low-pass filter 19A has a cutoff frequency (1 kHz, for example) in the vicinity of zero beat and yields a low-frequency signal when each spectrum passes the frequency Fx of the light Px. The low-frequency signal is rectified and smoothed by the detector 19B into a pulse signal. That is, upon each occurrence of the coincidence between each of the spectra $S_1$, $S_2$, $S_3$, ... being frequency swept and the frequency Fx, such a pulse as shown in FIG. 9B is produced as a signal indicating the zero-beat state. The zero-beat state signal is counted by the zero beat counter 19C.

The zero beat number n counted by the zero beat counter circuit 19 is provided to the frequency sweep control circuit 14. The frequency control circuit 14 starts the sweep of the ramp voltage $V_{SW}$ and, upon detection of an increment in count immediately after the sweep frequency $F_0$ has reached a predetermined frequency $F_{00}$, stops the sweep and resets the zero beat counter 19C, and the oscillation frequency $F_{01}$ measured by the frequency counter 13 during this suspension of the sweep is fetched into a calculation circuit 21. Thereafter, the frequency sweep is resumed and when the count value n of the zero beat counter circuit 19 has reached a preset number of times, for example, 100 times, the sweep of the ramp voltage $V_{SW}$ is stopped and the oscillation frequency $F_{02}$ at that time is fetched into the calculation circuit 21.

Figure 10A:
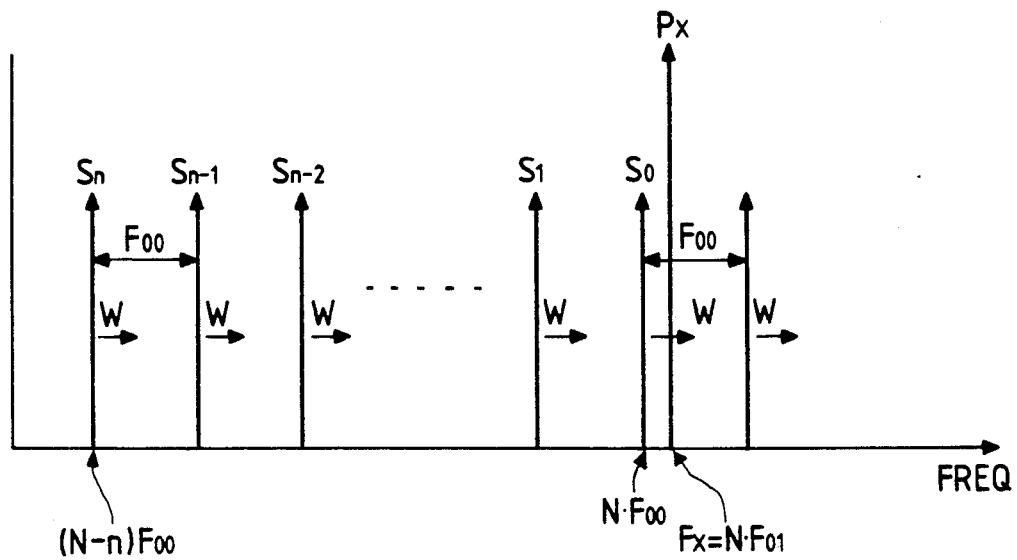
FIG. 10A is a graph showing the relationship between the laser light spectrum and the frequency of the light to be measured, prior to the frequency sweep in the light frequency measuring apparatus depicted in FIG. 8.
Figure 10B:
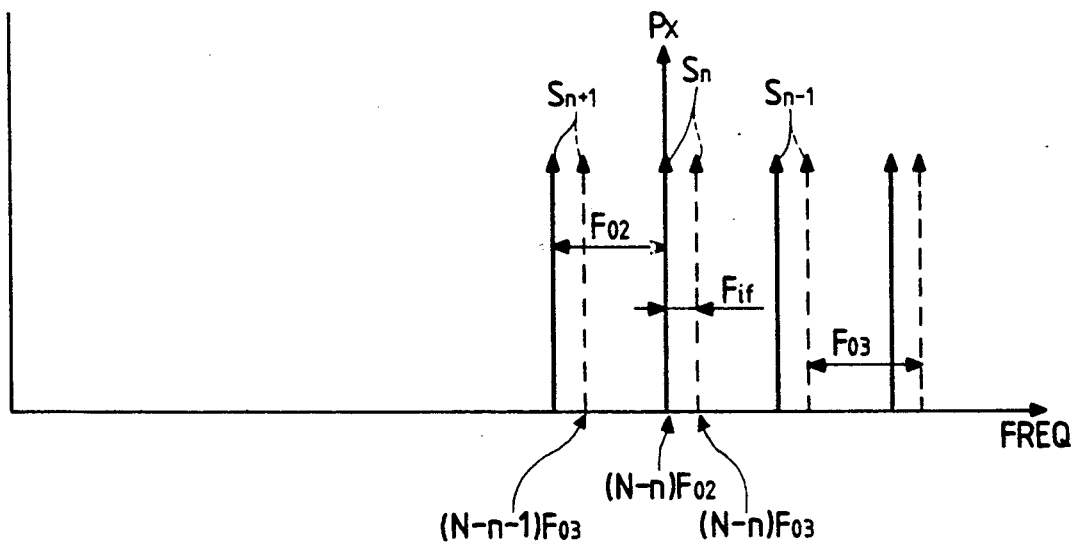
FIG. 10B is a graph showing the relationship between the laser light spectrum and the frequency of the light to be measured after the frequency sweep in the light frequency measuring apparatus depicted in FIG. 8.

FIGS. 10 and 10B shows the relationships between the laser light spectra (indicated by the solid-lined vertical arrows S) and the frequency (indicated by the solid-lined arrow Fx) of the light to be measured Px at the time point when $F_0 = F_{00}$ (which time point will hereinafter be referred to as the frequency sweep start point) and at the frequency sweep stop point, respectively. The suffix numbers of the reference characters $S_0$, $S_1$, $S_2$, ..., of the laser light spectra in FIG. 10A and 10B are attached to them in the order in which the spectra become equal to the frequency Fx of the light Px as they are swept in a direction in which the spectral frequency rises, and the order is opposite to that shown in FIG. 4.

Based on the measured values $F_{01}$ and $F_{02}$ and the zero beat count value n, the frequency Fx of the light to be measured Px can be obtained. Since the oscillation frequencies $F_{01}$ and $F_{02}$ at the sweep start point and the sweep stop point are both in the zero-beat state, the relationships between the frequency Fx of the light to be measured Px and the measured values $F_{01}$ and $F_{02}$ are given by the following equations:

$$Fx = N \cdot F_{01} \quad (1)$$

$$Fx = (N-n) \cdot F_{02} \quad (2)$$

where N is a number equal to the order of higher harmonics when the oscillation frequency $F_0$ is used as the fundamental wave. From Eqs. (1) and (2) the following equation can be obtained:

$$N = [n \cdot F_{02}/(F_{02} - F_{01})] \quad (3)$$

Letting X be an arbitrary number, Eq. [X] represents an integer which is the closest to the X. By calculating N based on Eq. (3), the true value of N can be determined and the frequency Fx can be calculated by Eq. (2) using the value of N. The frequency Fx thus calculated is displayed on a display 22 shown in FIG. 8.

Figure 11:
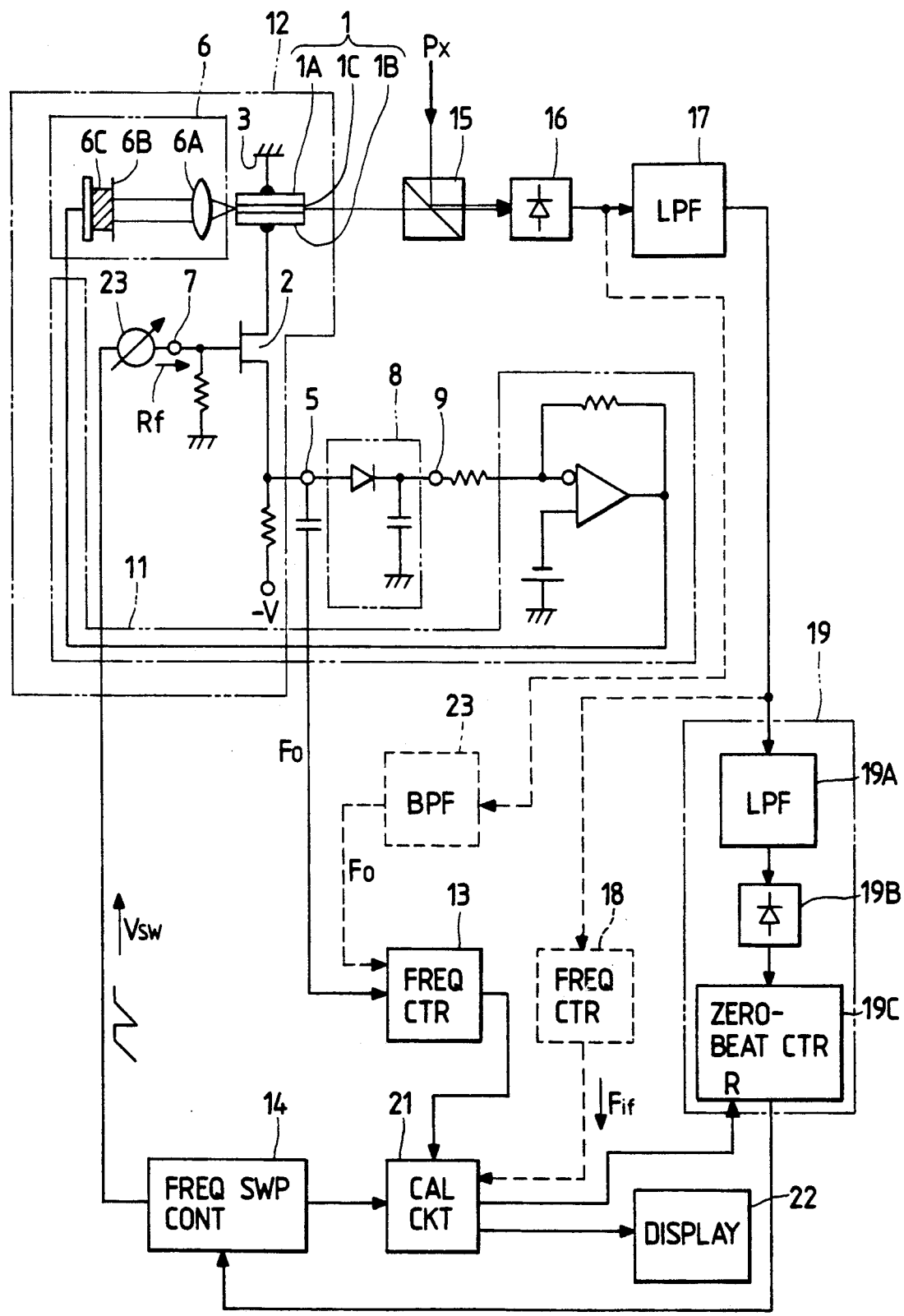
FIG. 11 is a block diagram illustrating an embodiment of the light frequency measuring apparatus according to another aspect of the present invention.

FIG. 11 illustrates an embodiment of the light frequency measuring apparatus according to the fifth aspect of the present invention. The light frequency measuring apparatus of this embodiment utilizes the optical pulse oscillator proposed according to the second and third aspects of the invention. That is, the input terminal 7 is connected to the gate of the microwave active element 2 and the reference signal $R_f$ is applied to the input terminal 7 from a reference signal source 23. The reference signal source 23 can be formed by a voltage-controlled oscillator, for instance. The ramp voltage $V_{SW}$ is applied from the frequency sweep control circuit 14 to the reference signal source 23 formed by the voltage-controlled oscillator, and the frequency $F_R$ of the reference signal $R_f$ from the reference signal source is subjected to the frequency sweep from the frequency $F_{01}$ to $F_{02}$ (see FIG. 9A).

The sample-hold circuit 8 is connected to the output side of the microwave active element 2 and the output at the output terminal 9 of the sample-hold circuit 8 is provided via the feedback circuit 11 to the driving element 6C of the delay controller 6. A closed loop is formed by the connection of the feedback circuit 11 and the oscillation frequency $F_0$ of the microwave active element 2 frequency sweeps following the oscillation frequency $F_{01}$ to $F_{02}$ of the reference signal source 23.

By the frequency sweep of the oscillation frequency $F_0$ of the microwave active element 2 from $F_{01}$ to $F_{02}$, the spectral frequency of the laser light from the laser light emitting element 1 is also subjected to a frequency sweep in the direction W shown in FIG. 10A. The frequency-swept laser light and the light to be measured Px are coupled together by the coupler 15. The coupled light is transduced by the opto-electro transducer 16 into an electric signal, which is applied to the zero beat counter circuit 19 to count the zero beat number n during the frequency sweep period. The zero beat count value n and the frequency measured values $F_{01}$ and $F_{02}$ available from the frequency counter 13 are utilized to obtain, by Eq. (3), N for determining the spectral frequency $N \cdot F_0$ of the laser light and the N is used to calculate the frequency Fx of the light Px by Eq. (2) as in the case of the second aspect of the invention, and the frequency Fx is displayed on the display 22.

By the way, it is impossible, in the embodiments of FIGS. 8 and 11, to detect the oscillation frequency $F_0$ of the microwave active element 2 exactly at the time of detection of the zero beat, because there is a time lag in actually stopping the sweep of the oscillation frequency $F_0$ of the microwave active element 2 in consequence of stoppage of the sweep of the ramp voltage by the frequency sweep control circuit 14 after the detection of the zero beat by the zero beat counter circuit 19. Further, the zero beat counter 19C counts, as a zero beat detection signal, the pulse-like signal which is yielded from the low-pass filter 19A when a difference beat frequency $F_{if}$, which is the output signal frequency of the low-pass filter 17, becomes lower than the cutoff frequency of the low-pass filter 19A. Hence, the zero beat detection signal has a pulse width corresponding to the pass bandwidth of the low-pass filter 19A. This means that it is impossible to detect the exact time point of the zero-beat state in which one of the sweep spectra of the laser light and the frequency Fx of the light to be measured Px completely coincide with each other and the zero beat frequency $F_{if}$ is reduced to zero. It is therefore impossible to determine the oscillation frequency $F_{02}$ exactly at the time of occurrence of the zero beat. Moreover, the frequency Fx of the light Px may vary in the time interval between the detection of the zero beat and the start of measurement of the oscillation frequencies $F_{01}$ and $F_{02}$. However, the frequency Fx of the light to be measured Px can be determined with high precision by stopping the frequency sweep at a time point different from that of the occurrence of the zero beat and then measuring the difference beat frequency $F_{if}$ at the sweep stopping time, as described below in conjunction with an embodiment of the light frequency measuring apparatus according to the sixth aspect of the present invention.

The apparatus according to the sixth aspect of the invention employs a frequency counter 18 for measuring the beat frequency $F_{if}$ of the output difference beat signal of the low-pass filter 17 as indicated by the broken line in FIGS. 8 or 11. When the zero-beat counter 19C has counted the occurrence of zero beat a predetermined number of times n, the frequency sweep control circuit 14 stops the frequency sweep to measure the oscillation frequency $F_{02}$ and then resumes the frequency sweep for an additional frequency $\Delta F$ which is smaller than the microwave oscillation frequency width $F_0/2 (N-n)$ which corresponds to the half of the spectrum spacing of the laser light, and thereafter stops the frequency sweep followed by measurement of the oscillation frequency $F_{03}$. That is, the value of $\Delta F$ is chosen such that the difference beat frequency $F_{if}$ at the sweep stopping time becomes lower than the half, $F_0/2$, of the spectrum spacing of the laser light. Incidentally, the oscillation frequency $F_0$ is swept substantially from the frequency $F_{00}$ to $F_{03}$ and since the sweep width is sufficiently small as compared with the oscillation frequencies $F_{00}$ and $F_{03}$, the oscillation frequency $F_0$ can be selected to be an arbitrary value within the oscillation frequency sweep range. Further, since $N-n$ holds in general, the value $\Delta F$ needs only to be selected smaller than $F_0/2N$. As the result of this, the spectra of the laser light also shift by the difference frequency $F_{if}$ as indicated by the broken lines in FIG. 10B and the shift amount $F_{if}$ can be obtained by measuring the output signal frequency of the low-pass filter 17 as the difference beat frequency.

As is evident from FIG. 10B, the frequency Fx of the light to be measured Px is given by the following equation:

$$Fx = (N-n) \cdot F_{03} - F_{if} \quad (4)$$

The oscillation frequency $F_{03}$ of the microwave active element 2 at the time when the oscillation frequency $F_0$ has been shifted by $\Delta F$ from the oscillation frequency $F_{02}$ (the zero-beat state) is measured by the frequency counter 13, and at the same time, the difference beat frequency $F_{if}$ which is the output signal frequency of the low-pass filter 17 is measured by the frequency counter 18. By substituting into Eq. (4) these measured values and the N obtained by Eq. (3), the frequency Fx of the light Px can be calculated. Since the calculation of Eq. (4) does not involve the values of the frequencies $F_{01}$ and $F_{02}$ which are measured after the detection of zero beat, the value of the oscillation frequency Fx can be determined with high accuracy.

A brief description will be given of the reason for which the value of the above-mentioned $\Delta F$ is selected smaller than $F_0/2N$.

The relationship between $\Delta F$ and $F_{if}$ is expressed by the following equation:

$$F_{if} = (F_{03} - F_{02}) \times (N-n) = \Delta F(N-n) \quad (5)$$

Assuming that the frequency Fx of the light to be measured Px lies between the spectra $S_n$ and $S_{n+1}$ indicated by the broken lines in FIG. 10B, there is the possibilities that the difference beat frequency $F_{if}$ of the same value is obtained as the difference between the frequency Fx and the frequency $F_{03}(N-N)$ of the broken-lined spectrum $S_n$ and between the frequency Fx and the frequency $F_{03}(N-n-1)$ of the broken-lined spectrum $S_{n+1}$, but in the latter case the count value n and the spectrum $S_{n+1}$ do not correspond to each other, resulting in a erroneous measurement. To avoid this, it is necessary to extract only the difference beat frequency $F_{if}$ between the frequency Fx and the broken-lined spectrum $S_n$ of the same order as that of the solid-lined spectrum $S_n$ which caused the zero beat detected immediately before the stoppage of the frequency sweep. To this end, it is necessary to stop the sweep within the range in which the frequency $F_{if}$ will not exceed $F_{02}/2$, after counting the zero beat number n. Accordingly, $\Delta F$ needs only to be selected to satisfy $\Delta F < F_{02}/2(N-n)$. Since the following equation holds:

$$F_{02}/2(N-n) > F_{02}/2N > F_{00}/2N,$$

$\Delta F$ needs only to be selected smaller than $F_{00}/2N$. In the case where N and n are selected to be about $2 \times 10^4$ and 100 or so, respectively, as referred to previously, it will suffice to select $F_0$ to be an arbitrary value within the sweep frequency region and $\Delta F$ to be smaller than $F_0/2N$. More preferably, $\Delta F$ is chosen as given by the following equation so as to allow variations in the frequency Fx of the light Px as much as possible.

$$\Delta F = F_{02}/4(N-n) \simeq F_{00}/4N \quad (6)$$

Also in this case, if N and n are chosen as mentioned above, then $\Delta F$ can be selected to be $F_0/4N$ relative to the arbitrarily determined frequency $F_0$ in the sweep frequency region.

In the embodiment which performs the additional sweep of the frequency $\Delta F$, when the zero beat number n has been reached, the frequency sweep is stopped and the oscillation frequency $F_{02}$ is measured and then the frequency sweep is performed additionally by $\Delta F$, but the frequency sweep need not be stopped when the zero beat count reaches n and, instead, the additional sweep of the frequency $\Delta F$ may continually follow. In such an instance, the frequency $F_{02}$ is not measured and the value N is determined by the following equation derivable from Eqs. (1) and (4) and then the frequency Fx is calculated by substituting the value of N and the frequencies $F_{if}$ and $F_{03}$ into Eq. (4).

$$N = [(F_{if} + nF_{03})/(F_{03} - F_{01})] \quad (7)$$

While in the embodiments of FIGS. 8 and 11 the oscillation frequency $F_0$, i.e. the frequencies $F_{01}$, $F_{02}$ and $F_{03}$ are measured by measuring the microwave oscillation signal from the output terminal 5 of the microwave active element 2 by use of the frequency counter 13, it is also possible to adopt an arrangement in which a band-pass filter 23 having a center frequency $F_0$ is connected to the output of the opto-electro transducer 16 as indicated by the broken lines in FIGS. 8 and 11, the signal component of the oscillation frequency $F_0$ is extracted by the band-pass filter 23 and the frequency $F_0$ is measured by the frequency counter 13.

Figure 12:
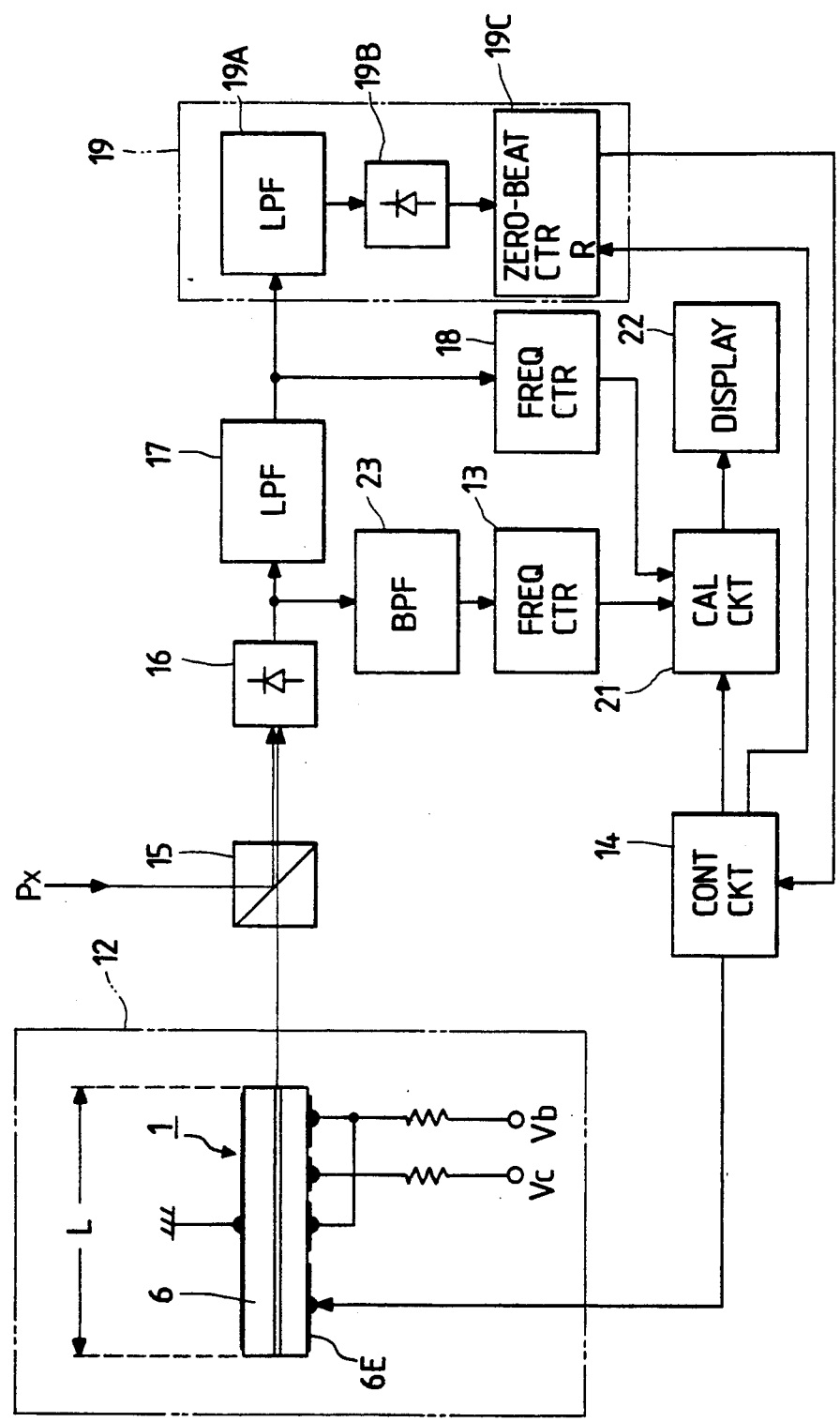
FIG. 12 is a block diagram illustrating an embodiment of the light frequency measuring apparatus according to still another aspect of the present invention.

FIG. 12 illustrates in block form an embodiment of the light frequency measuring apparatus according to the seventh aspect of the present invention, which is a modified form of the apparatus shown in FIG. 8.

This embodiment employs, in the optical pulse oscillator 12, a CPM (Colliding-Pulse Mode-Locking) laser diode 1 (Chen et al, Appl. Phys. Letters, Vol. 58, No. 12, 1991, pp1253-1255). The CPM laser diode is supplied with proper bias voltages Vb and Vc to emit pulsed light mode-locked at a resonance frequency dependent on the optical waveguide length L. In this embodiment a modulating electrode 6E is formed on a portion forming part of the resonator of the CPM laser diode 1 to form the delay controller 6. Since the refractive index of the optical waveguide of the delay controller 6 varies with applied voltage or current, the delay time or laser light which travel back and forth in the optical waveguide of the delay controller 6 is controlled. Accordingly, the pulse oscillation frequency $F_0$ varies and the cavity length L of the laser diode 1 varies equivalently, causing variations in the spectral wavelength of the laser light pulse which is produced. The repetitive frequency $F_0$ of the light pulse is expressed by $F_0 = C/nL$, where n is the refractive index of the optical waveguide and C is the velocity of light in a vacuum.

As in the case of the FIG. 8 embodiment, the laser light emitted from the laser diode 1 is coupled with the coherent light Px to be measured, by the coupler 15, and the coupled light is transduced by the opto-electro transducer 16 into an electric signal containing the frequency component of the difference between the laser light and the coherent light Px. The electric signal is applied to the low-pass filter 17 to extract the component of the difference frequency $F_{if} = Fx - N \cdot F_0$, which is provided to the zero-beat counter circuit 19. The cavity length L of the laser diode 1 is controlled by the ramp voltage (or current) which is produced by the frequency sweep control circuit 14 and the spectrum of the laser light is swept. This embodiment does not use such a microwave active element 2 as used in the FIG. 8 embodiment, because the CPM laser diode 1 generates light pulses of the repetitive frequency $F_0$. Accordingly, in this embodiment the output of the opto-electro transducer 16 is applied to the band-pass filter 23 to extract the component of the frequency $F_0$ and the frequency component thus extracted is measured by the frequency counter 13 to thereby measure the frequencies $F_{01}$, $F_{02}$ and $F_{03}$ in the embodiment of FIG. 8. Since the principles of measuring the wavelength of the light Px are the same as in the case of FIG. 8, no description will be given of the operation therefor.

As described above, with the optical pulse oscillator according to the first aspect of the present invention, it is possible to simultaneously obtain the electric signal SF having the self-oscillation frequency $F_0$ of the microwave active element 2 and the laser light of the frequency $N \cdot F_0$ which bears a higher harmonic relation to the self-oscillation frequency $F_0$. Hence, the light emitting frequency of the laser light emitting element 1 can be known by measuring the self-oscillation frequency $F_0$ of the microwave active element 2. Thus, the light emitting frequency of the laser light emitting element 1 can be detected without the necessity of using an expensive light frequency measuring instrument—this allow ease in measuring the frequency of light.

The optical pulse oscillator according to the second aspect of the present invention has the construction in which the sample-hold circuit 8 provides the signal SL having the frequency difference $F_0 - F_R$ between the frequency $F_R$ of the external reference signal $R_f$ and the self-oscillation frequency $F_0$ of the microwave active element 2. Hence, if the frequency $F_R$ of the reference signal $R_f$ is preknown, the self-oscillation frequency $F_0$ of the microwave active element 2 can be obtained by measuring the difference frequency $F_0 - F_R$. The difference frequency $F_0 - F_R$ is sufficiently lower than those $F_0$ and $F_R$ in the microwave band, and hence can easily be measured. Furthermore, a simple measuring instrument such as an oscillograph can also be used for observing waveforms and measuring frequencies.

With the optical pulse oscillation according to the third aspect of the present invention, the self-oscillation frequency of the microwave active element 2 can be brought into agreement with the frequency of the external reference signal. This offers an advantage that the light emitting frequency of the laser light emitting element 1 can be set arbitrarily in its light-emittable wavelength range by a suitable selection of the frequency of the reference signal.

With the light frequency measuring apparatus according to the fourth to seventh aspects of the present invention, the frequency of light can be measured with a high degree of accuracy. The accuracy of a conventional wavemeter using a Michelson inter-ferometer is about 1 pp, but the present invention achieves measurement accuracy substantially in the range of $10^{-10}$ $10^{-11}$.

Although the above embodiments have been described to employ a laser diode as the laser light emitting element 1, it is also possible to utilize a solid laser such as a YAG laser, or a gas laser, in addition to the laser diode. Besides, negative resistance elements such as gun diode as well as a field effect transistor may also be used as the microwave active element 2.

It will be apparent that many modifications and variations may be effected without departing from the scope of the novel concepts of the present invention.

What is claimed is:

1. An optical pulse oscillator, comprising:
    a laser light emitting element which emits multimode laser light;
    delay control means for controlling feeding back of the multimode laser light emitted from said laser light emitting element after being delayed for a desired period of time;
    a microwave active element connected in a series-connected portion with a drive current path to said laser light emitting element, having an oscillation frequency and showing a negative resistance characteristic in said series-connected portion;
    an electrical output terminal for extracting a change in a current flowing across said microwave active element;
    a light emitting part for emitting therethrough said multimode laser light from said laser light emitting element;
    an input terminal for applying therethrough an external signal to said microwave active element connected thereto; and
    a sample-hold circuit connected to said electrical output terminal, for extracting a signal corresponding to the phase difference between the oscillation frequency of said microwave active element and the external signal applied to said input terminal.

2. The optical pulse oscillator of claim 1, further comprising a feedback circuit for feeding back the output signal of said sample-hold circuit to said delay control means to vary its delay time, thereby making the oscillation frequency of said microwave active element equal to the frequency of said external signal applied to said input terminal.

3. A light frequency measuring apparatus comprising:
    optical pulse oscillating means which has delay control means for feeding back thereto emitted laser light after delaying it for a desired period of time, oscillates pulses at a resonance frequency defined by the delay time of said delay means and repeatedly emits, at said pulse oscillation frequency, laser light pulses of spectral frequencies which are integral multiples of said pulse oscillation frequency;
    frequency sweep control means which applies a ramp signal to said optical pulse oscillating means to vary said delay time of said delay control means to sweep said pulse oscillation frequency, thereby sweeping said spectral frequencies of said laser light pulses;
    frequency measuring means for measuring said pulse oscillation frequency at the start and stopping of said frequency sweep by said frequency sweep control means;
    coupling means for coupling said laser light pulses emitted from said optical pulse oscillating means and light to be measured;
    opto-electro transducer means whereby said coupled light by said coupling means is transduced into an electric signal;
    zero-beat counting means for counting how many times a difference beat between the frequency of said light to be measured and said spectral frequencies of said laser light from said optical pulse oscillating means reaches the state of zero beat as said pulse oscillation frequency is swept and for stopping said frequency sweep by said frequency sweep control means after said counting has reached a predetermined count value; and calculating means for calculating said frequency of said light to be measured, based on said pulse oscillation frequencies measured by said frequency measuring means at the start an stopping of the said frequency sweep and said frequency sweep and said predetermined count value of said counting.

4. The light frequency measuring apparatus of claim 3, wherein said optical pulse oscillating means includes a laser light emitting element optically coupled to said delay control means, a drive current circuit for driving said laser light emitting element, and a microwave active element connected in series to said drive current circuit, said microwave active element having a negative resistance characteristic in a microwave resonance frequency band determined by said laser light emitting element and said delay control means and oscillating pulses at a frequency within said microwave resonance frequency band.

5. The light frequency measuring apparatus of claim 4, wherein said frequency measuring means is connected to one terminal of said microwave active element and measures the pulse oscillation frequency of said microwave active element.

6. The light frequency measuring apparatus of claim 4, wherein said frequency measuring means includes band-pass filter of said microwave resonance frequency band connected to the output of said opto-electro transducer means and measures the oscillation frequency of said pulse oscillation frequency component extracted by said band-pass filter from the output signal of said opto-electro transducer means.

7. The light frequency measuring apparatus of claim 5, wherein said frequency sweep control means includes a frequency sweep control circuit which generates and applies said ramp signal to said delay control means to control the delay time of said laser light which is fed back to said laser light emitting element.

8. The light frequency measuring apparatus of claim 5, wherein said frequency sweep control means includes: a frequency sweep control circuit for generating said ramp signal; reference signal generating means for generating a reference signal frequency-swept by said ramp signal and for applying said reference signal to a control terminal of said microwave active element; sample-hold means connected to said microwave active element, for generating a signal corresponding to the phase difference between the oscillation signal of said microwave active element and said reference signal; and feedback means which compares the output of said sample-hold means with a reference level and applies said delay control means with a signal corresponding to the difference between them to control said delay time, thereby causing the pulse oscillation frequency of said microwave active element to agree with the frequency of said reference signal.

9. The light frequency measuring apparatus of claim 3, wherein said optical pulse oscillating means includes a pulse mode-locking laser diode, a driver for driving said pulse mode-locking laser diode and said delay control means formed as a unitary structure with said pulse mode-locking laser diode, and wherein said frequency measuring means includes a band-pass filter of said microwave resonance frequency band connected to the output of said opto-electro transducer menas and measures the oscillation frequency of said pulse oscillation frequency component extracted by said band-pass filter from the output signal of said opto-electro transducer means.

10. The light frequency measuring apparatus of claim 3, further comprising low-pass filter means for extracting said difference beat component from the output of said opto-electro transducer means and beat frequency measuring means for measuring the frequency of said difference beat component, and wherein said frequency sweep control means stops said frequency sweep after additionally performing it by a predetermined frequency when said zero-beat counting means has counted said zero beat by said predetermined value and said calculating means calculates the frequency of said light to be measured, based on said zero-beat count value, said pulse oscillation frequency at the start of said frequency sweep, said pulse oscillation frequency at the end of said additional frequency sweep and said beat frequency at the end of said additional frequency sweep.

11. The light frequency measuring apparatus of claim 6, wherein said frequency sweep control means includes a frequency sweep control circuit which generates and applies said ramp signal to said delay control means to control the delay time of said laser light which is fed back to said laser light emitting element.

12. The light frequency measuring apparatus of claim 6, wherein said frequency sweep control means includes:

a frequency sweep control circuit for generating said ramp signal;

reference signal generating means for generating a reference signal frequency-swept by said ramp signal and for applying said reference signal to a control terminal of said microwave active element;

sample-hold means connected to said microwave active element, for generating a signal corresponding to the phase difference between the oscillation signal of said microwave active element and said reference signal; and feedback means which compares the output of said sample-hold means with a reference level and applies said delay control means with a signal corresponding to the difference between them to control said delay time, thereby causing the pulse oscillation frequency of said microwave active element to agree with the frequency of said reference signal.

13. The light frequency measuring apparatus of claim 4, further comprising low-pass filter means for extracting said difference beat component from the output of said opto-electro transducer means and beat frequency measuring means for measuring the frequency of said difference beat component, and wherein said frequency sweep control means stops said frequency sweep after additionally performing it by a predetermined frequency when said zero-beat counting means has counted said zero beat by said predetermined value and said calculating means calculates the frequency of said light to be measured, based on said zero-beat count value, said pulse oscillation frequency at the start of said frequency sweep, said pulse oscillation frequency at the end of said additional frequency sweep and said beat frequency at the end of said additional frequency sweep.

14. The light frequency measuring apparatus of claim 9, further comprising low-pass filter means for extracting said difference beat component from the output of said opto-electro transducer means and beat frequency measuring means for measuring the frequency of said difference beat component, and wherein said frequency sweep control means stops said frequency sweep after additionally performing it by a predetermined frequency when said zero-beat counting means has counted said zero beat by said predetermined value and said calculating means calculates the frequency of said light to be measured, based on said zero-beat count value, said pulse oscillation frequency at the start of said frequency sweep, said pulse oscillation frequency at the end of said additional frequency sweep and said beat frequency at the end of said additional frequency sweep.

* * * * *